(12) United States Patent
Kim et al.

(10) Patent No.: US 9,040,230 B2
(45) Date of Patent: May 26, 2015

(54) RESIST INK AND METHOD OF FORMING PATTERN USING THE SAME

(71) Applicant: LG Display Co., Ltd., Seoul (KR)

(72) Inventors: Sung-Hee Kim, Gyeonggi-Do (KR); Byung-Geol Kim, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/731,965

(22) Filed: Dec. 31, 2012

(65) Prior Publication Data

US 2014/0331898 A1 Nov. 13, 2014

Related U.S. Application Data

(62) Division of application No. 12/612,809, filed on Nov. 5, 2009, now Pat. No. 8,354,220.

(30) Foreign Application Priority Data

Nov. 7, 2008 (KR) .................. 10-2008-0110626

(51) Int. Cl.
*C09D 11/02* (2014.01)
*G03F 7/00* (2006.01)
*G03F 7/075* (2006.01)

(52) U.S. Cl.
CPC .............. *C09D 11/02* (2013.01); *G03F 7/0007* (2013.01); *G03F 7/0755* (2013.01)

(58) Field of Classification Search
CPC ...... G03F 7/0755; G03F 7/2018; C09D 11/02
USPC ........................................... 430/270.1
See application file for complete search history.

(56) References Cited

U.S. PATENT DOCUMENTS

| 8,012,652 | B2 | 9/2011 | Kim et al. | |
|---|---|---|---|---|
| 2002/0065332 | A1* | 5/2002 | Choi et al. | 521/82 |
| 2003/0207217 | A1* | 11/2003 | Suzuki et al. | 430/511 |
| 2005/0084613 | A1* | 4/2005 | wang et al. | 427/282 |
| 2008/0264902 | A1* | 10/2008 | Song et al. | 216/43 |

FOREIGN PATENT DOCUMENTS

| CN | 1845795 A | 10/2006 |
|---|---|---|
| CN | 101295132 A | 10/2008 |
| JP | 2006-124546 | 5/2006 |
| KR | 10-2008-0096030 | 10/2008 |

OTHER PUBLICATIONS

Chinese Office Action issued on Sep. 15, 2011 in corresponding Chinese Patent Application No. 200910220851.6.
Office Action dated Jun. 18, 2013 from the Korean Intellectual Property Office in Korean counterpart application No. 10-2008-0110626.

* cited by examiner

*Primary Examiner* — Brittany Raymond
(74) *Attorney, Agent, or Firm* — Morgan, Lewis & Bockius LLP

(57) ABSTRACT

Disclosed is a resist ink having superior acid-resistance and coupling property, the resist ink composed of 70% or less by weight of solvent, 10-15% by weight of base polymer, 10-15% by weight of tacktifier, 3% or less by weight of additive, and 1-10% by weight of coupling agent.

13 Claims, 6 Drawing Sheets

RESIST INK AND METHOD OF FORMING PATTERN USING THE SAME

This is a divisional of U.S. patent application Ser. No. 12/612,809, filed Nov. 5, 2009, which is hereby incorporated by reference.

BACKGROUND OF THE INVENTION

1. Field of the Invention

The present invention relates to a resister ink and a pattern formation method, and particularly, to a register ink which has an enhanced acid-resistance due to an addition of a silane coupling agent and can prevent a defect caused by a liquation of remnants, and a pattern formation method using the same.

2. Background of the Invention

A display device, especially, a flat panel display device, such as a liquid crystal display (LCD) device, is driven by employing an active device, e.g., a thin film transistor, at each pixel. This type of driving method of the display device is usually referred to as an active matrix driving method. The active matrix driving method is achieved such that the active device is disposed at each of pixels, arranged in a matrix configuration, thus to drive the corresponding pixel.

Figure 1:
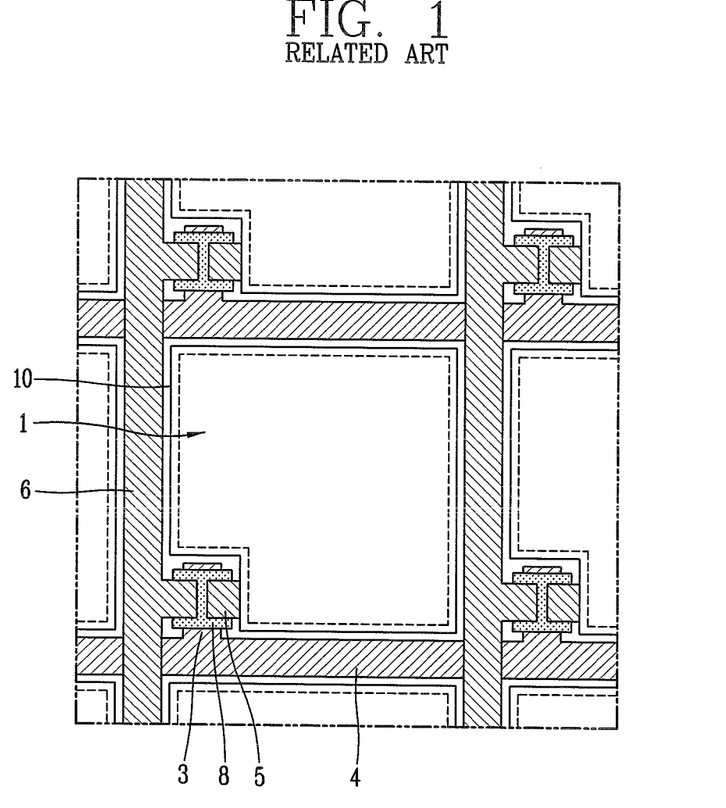
FIG. 1 is a planar view showing a structure of a typical LCD device.

FIG. 1 shows an active matrix type LCD device. The LCD device with the structure shown in FIG. 1 is a thin film transistor (TFT) LCD device which employs TFTs as the active device. Referring to FIG. 1, the TFT is located in each pixel of the LCD device having N×M pixels disposed vertically and horizontally. Each of the TFTs is formed at an intersection between a gate line 4 to which a scan signal is applied from an external driving circuit and a data line 6 to which an image signal is applied therefrom. The TFT is provided with a gate electrode 3 connected to the gate line 4, a semiconductor layer 8 formed on the gate electrode 3 and activated responsive to a scan signal applied to the gate electrode 3, and a source/drain electrode 5 formed on the semiconductor layer 3. A display region of a pixel 1 is provided with a pixel electrode 10, which is connected to the source/drain electrode 5 so that an image signal is applied thereto via the source/drain electrode 5 in response to the activation of the semiconductor layer 8, thereby operating a liquid crystal (not shown).

Figure 2:
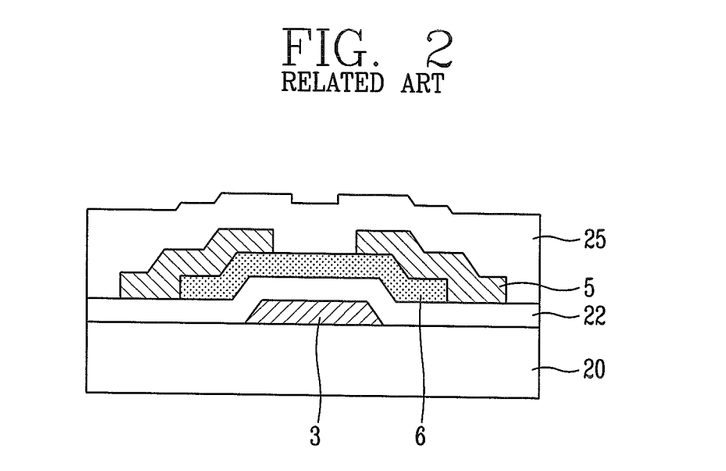
FIG. 2 is a cross-sectional view showing the structure of the TFT of FIG. 1.

FIG. 2 shows a structure of the TFT located in each pixel. As shown in FIG. 2, the TFT includes a substrate 20 formed of a transparent insulating material such as glass, a gate electrode 3 formed on the substrate 20, a gate insulating layer 22 laminated over the entire substrate 20 located on the gate electrode 2, a semiconductor layer 6 formed on the gate insulating layer 22 and activated upon a signal being applied to the gate electrode 3, a source/drain electrode 5 formed on the semiconductor layer 6, and a passivation layer 25 formed on the source/drain electrode 5 for protecting a device.

The source/drain electrode 5 of the TFT is electrically connected to the pixel electrode formed in each pixel. Accordingly, when a signal is applied to the pixel electrode via the source/drain electrode 5, a liquid crystal is driven so as to display an image.

As stated above, the active matrix type display device, such as the LCD device, has pixels each having several tens of nanometers in size. Hence, the active device, such as the TFT, disposed within the pixel, should be minutely formed to be several nanometers in size. In particularly, the increase in demands on the high definition display devices such as high definition television(HDTV) requires that more pixels be disposed within the same scale screen, accordingly active device patterns (including gate line patterns and data line patterns) disposed within each pixel also have to be more minutely formed.

In the meantime, in order to fabricate the active device such as the TFT in the related art, patterns or lines of the active device have been formed by a photolithography using an exposure system. However, the related art pattern formation has to adopt a photolithography by an exposure process performed after laminating a photoresist on a layer to be patterned. Here, since the exposure system has a limited exposure area, the photolithography should be performed by splitting a screen in order to fabricate a large display device. Therefore, upon the photolithography process for the split areas, an accurate position alignment of the exposed areas is difficult and also the photolithography should be repeated plural times, resulting in lowering of productivity.

In order to obviate such problems, a printing method has been recently proposed in which a resist pattern is formed by printing a resist ink directly on an etching target layer, such as a metal, by use of a roll, and then the etching target layer is etched with an etching solution under a state of masking the lower etching target layer with the resist pattern.

The printing method is implemented such that a resist ink with a desire form (i.e., a form depending on a pattern shape) is formed on a print roll, which is then rolled on a substrate so as to transcribe the resist ink thereon, thereby forming a resist pattern. However, the etching by the related art printing method has the following problems.

Typically, a photoresist is photocrosslinked as light is irradiated with a photo initiator being added because patterns are formed by exposure process, while the printing method derives the crosslink by a backing process other than the photocrosslink. However, in the baking process, if part of components remains without being crosslinked after being baked, when an etching solution is added, remnants are liquated, thereby causing damage such as a generation of a pin hole in a resist link. The damage on the resist ink may cause a defect upon etching the etching target layer. Further, the resist ink may be peeled away by the remnants during wet etching, thereby exposing a metal layer. Consequently, the etching solution even etches the exposed metal layer. As a result, a width of a pattern may problematically be narrower than a preset width or even a short-circuit may occur in the pattern.

SUMMARY OF THE INVENTION

Therefore, to obviate the above problems, an object of the present invention is to provide a resist link which has an enhanced acid-resistance due to addition of a silane coupling agent to the resist ink and can prevent a defect due to a pin hole or the like.

Another object of the present invention is to provide a method for forming a pattern by use of the above fabricated resist ink.

To achieve the objects of the present invention, a resist ink may be composed of 70% or less by weight of solvent, 10-15% by weight of base polymer, 10-15% by weight of tackifier, 3% or less by weight of additive, and 1-10% by weight of coupling agent.

The solvent may be composed of a carrier solvent such as ethanol or methanol and a printing solvent such as ethoxypropanol. The coupling agent may be one of methacryloxy propyltrimethoxy silane, N-(2-aminoethyl)-3-aminopropyltrimethoxy silane, γ-mercapto-propyltriethoxy silane, N-[2-vinylbenzylamino)ethyl]-3-aminopropyltriethoxy silane, 3-methacryloxy propyltrimethoxy silane and 3-glycidoxy propyltrimethoxy silane, which is selectively used depending on a solvent.

In the present invention, an addition of a silane coupling agent to a resist ink leads to a formation of a crosslink and an improved coupling force between the resist ink and an etching target layer, such as a substrate or a metallic layer, which prevents a pin hole from being formed due to a liquation of non-crosslinked components and enhances an acid-resistance of the resist link. Therefore, when forming a pattern by employing the resist ink, a defective pattern due to the damage of the resist ink can be obviated.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Description will now be given in detail of a resist ink and a pattern formation method using the same in accordance with the present invention, with reference to the accompanying drawings.

Figure 3A:
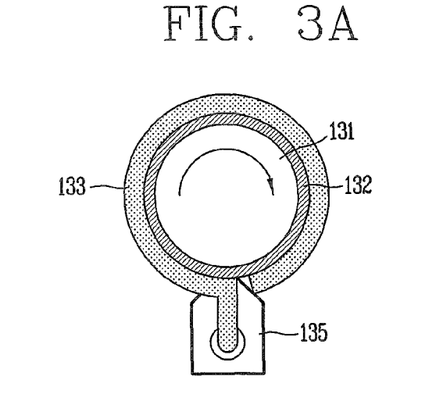
FIGS. 3A to 3E are views showing a pattern formation method in accordance with the present invention.

FIGS. 3A to 3E are showing a pattern formation method for an LCD device in accordance with the present invention. As shown in FIG. 3A, a blanket 132 is formed on the surface of a cylindrical roll 131, and a resist ink film 133 is coated on the blanket 132 via a resist ink feeder 135.

Figure 3B:
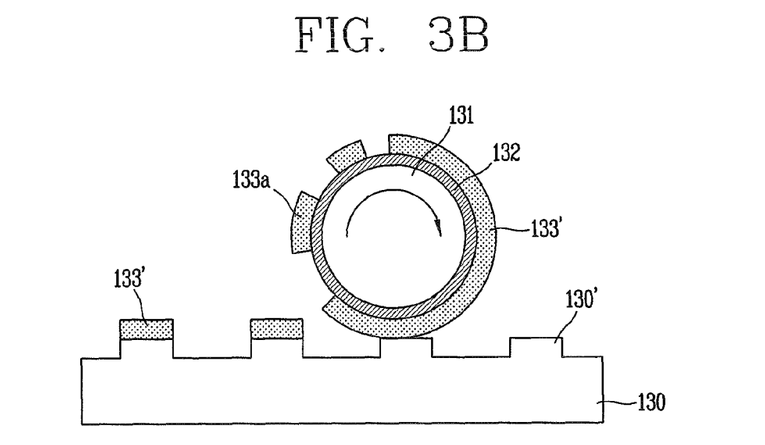

Referring to FIG. 3B, a cliché 130 having a plurality of convex patterns 130' on the surface thereof is prepared. As the roll 131 coated with the resist ink film 133 is rolled on the surface of the cliché 130 in a contacted state, the resist ink contacted with the cliché 130 is removed so that a resist link pattern 133a is formed on the blanket 132 which is not contacted with the convex patterns 130' of the cliché 130. Here, the cliché 130 having the convex patterns 130' may be formed by the conventional photolithography. That is, a substrate formed of glass is prepared. A metallic layer is deposited on the entire substrate to be then patterned, thereby forming metallic patterns. Afterwards, the substrate is etched by use of the metallic patterns as a mask, thereby forming the convex patterns 130' on the metallic pattern-formed areas. Here, the metallic patterns may alternatively be developed.

As the roll 131 coated with the resist ink film 133 is rolled on the surface of the thusly fabricated cliché 130, resist ink films 133' on the non-contacted portions with the convex patterns 130' remain on the surface of the cliché 132 as resist ink patterns 133a.

Figure 3C:
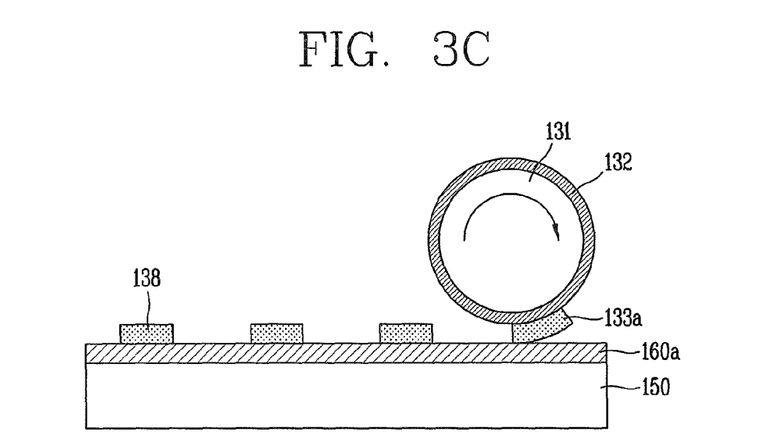

Referring to FIG. 3C, an etching target layer 160a is formed on a substrate 150. The etching target layer 160a may be a metal layer, a semiconductor layer or an insulating layer. For the metal layer, a metal may be stacked on the substrate 150 by sputtering. For the semiconductor layer, an amorphous semiconductor or crystalline semiconductor such as Si or the like may be stacked on the substrate 150 by plasma enhanced chemical vapor deposition (PECVD). Also, for the insulating layer, an inorganic material may be stacked on the substrate 150 by the CVD scheme or an organic material may be coated on the substrate 150 by a spin coating or the like.

When the roll 131 having the resist ink patterns 133a remaining thereon is rolled in a contact state with the etching target layer 160a on the substrate 150, the resist ink patterns 133a remaining on the roll 131 are transcribed on the surface of the etching target layer 160a. If the resist ink patterns 133a transcribed on the etching target layer 160a are heated up at a temperature of about 150° C. for about 3 minutes so as to be baked, resist ink patterns 138 are formed on the etching target layer 160a.

Figure 3D:
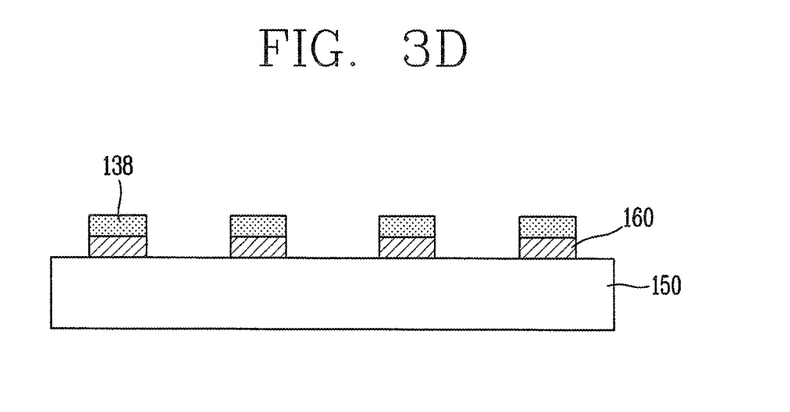
Figure 3E:
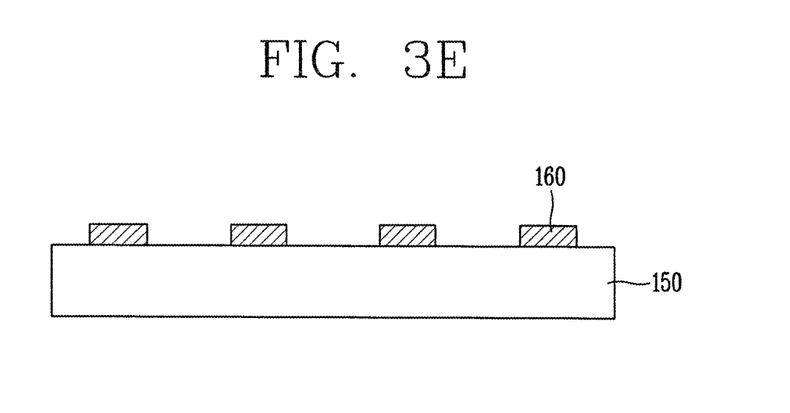

Afterwards, referring to FIG. 3D, an etching solution is applied on the etching target layer 160a in a state of partially blocking the etching target layer 160a with the resist patterns 138 so as to etch the etching target layer 160a, thereby forming patterns 160 beneath the resist ink patterns 138. Here, if the etching target layer 160a is a metal layer, an acid etching solution such as HF may be applied to etch the etching target layer 160a. If the etching target layer 160a is a semiconductor layer or an insulating layer, an etching gas may be applied to etch the etching target layer 160a. Afterwards, referring to FIG. 3E, the resist patterns 138 are developed and the patterns 160 are formed on the substrate 150 accordingly.

In the pattern formation method according to the present invention, a resist ink different from the conventional resist ink is employed so as to prevent the occurrence of defective patterns 160 upon etching, due to the generation of pin holes or the like in the resist ink or the peeling of the resist ink. That is, the present invention adds a coupling agent to the resist ink and crosslinks the resist ink, resulting in prevention of the damage on the resist patterns due to the action of the etching solution.

The coupling agent is a material which acts between incompatible materials to form a crosslink between the two materials so as to improve an adhesive property or binding affinity therebetween. The present invention may add the coupling agent to the resist ink so as to prevent part of components of the resist ink from remaining without being crosslinked.

Especially, the present invention employs silane coupling agent, a metal coupling agent such as titanate, organic chrome complex and aluminate, phosphate coupling agent, and the like, more particularly, mostly employs the silane coupling agent. Here, a main material of the resist ink is methanol. The silane coupling agent exhibits the greatest reactivity with the methanol, accordingly the silane coupling agent is employed in the present invention. Also, upon the use of the silane coupling agent, the acid-resistance of the resist ink is enhanced. Hence, the silane coupling agent is usually employed. However, the coupling agent employed in the present invention is not limited to the silane coupling agent. Depending on a material of the resist ink or the like, any other coupling agent as well as the metal coupling agent or the phosphate coupling agent may be utilized.

Therefore, the following description will be given by exemplarily employing the silane coupling agent, which is however exemplary for clarity without the limitation of the present invention.

The addition of the coupling agent into the resist ink improves the adhesive (coupling) force between a surface of a metal layer, such as Al, AlNd or Mo and a surface of an organic insulating layer composed of the resist ink. The present invention uses a low molecular material having a boiling point of more than 200° C. as the silane coupling agent. Here, the type of a coupling agent added may depend on a type of solvent contained in the resist ink.

For the use of alcohol solvent, a silane coupling agent, such as methacryloxy propyltrimethoxy silane, γ-mercapto-propyltriethoxy silane or N-(2-aminoethyl)-3-aminopropyltrimethoxy silane, is used. For the use of thermosetting solvent, a silane coupling agent, such as N-(2-aminoethyl)-3-aminopropyltrimethoxy silane, is used.

Furthermore, for the use of an alkyl solvent as a thermoplastic solvent, a silane coupling agent, such as N-(2-aminoethyl)-3-aminopropyltrimethoxy silane, is used. For the use of phenyl solvent, a silane coupling agent, such as N-[2-vinylbenzylamino)-ethyl]-3-aminopropyltrimethoxy silane, is used. For the use of an unsaturated solvent, a silane coupling agent, such as 3-methacryloxy propyltrimethoxy silane, is used. For the use of an amine sensitive solvent, a silane coupling agent, such as 3-glycidoxy propyltrimethoxy silane, is used.

When such silane coupling agent is coupled to the resist ink, the resist ink is crosslinked and also the coupling force between the resist ink and a substrate or metal layer is enhanced. The thusly enhanced coupling force will be described in conjunction with FIG. 4. Here, various types of coupling agents may be employed as the coupling agent; hereinafter, the silane coupling agent will be exemplarily illustrated. Other types of coupling agents can also enhance the coupling force of the resist ink by a similar reaction to the silane coupling agent.

Figure 4:
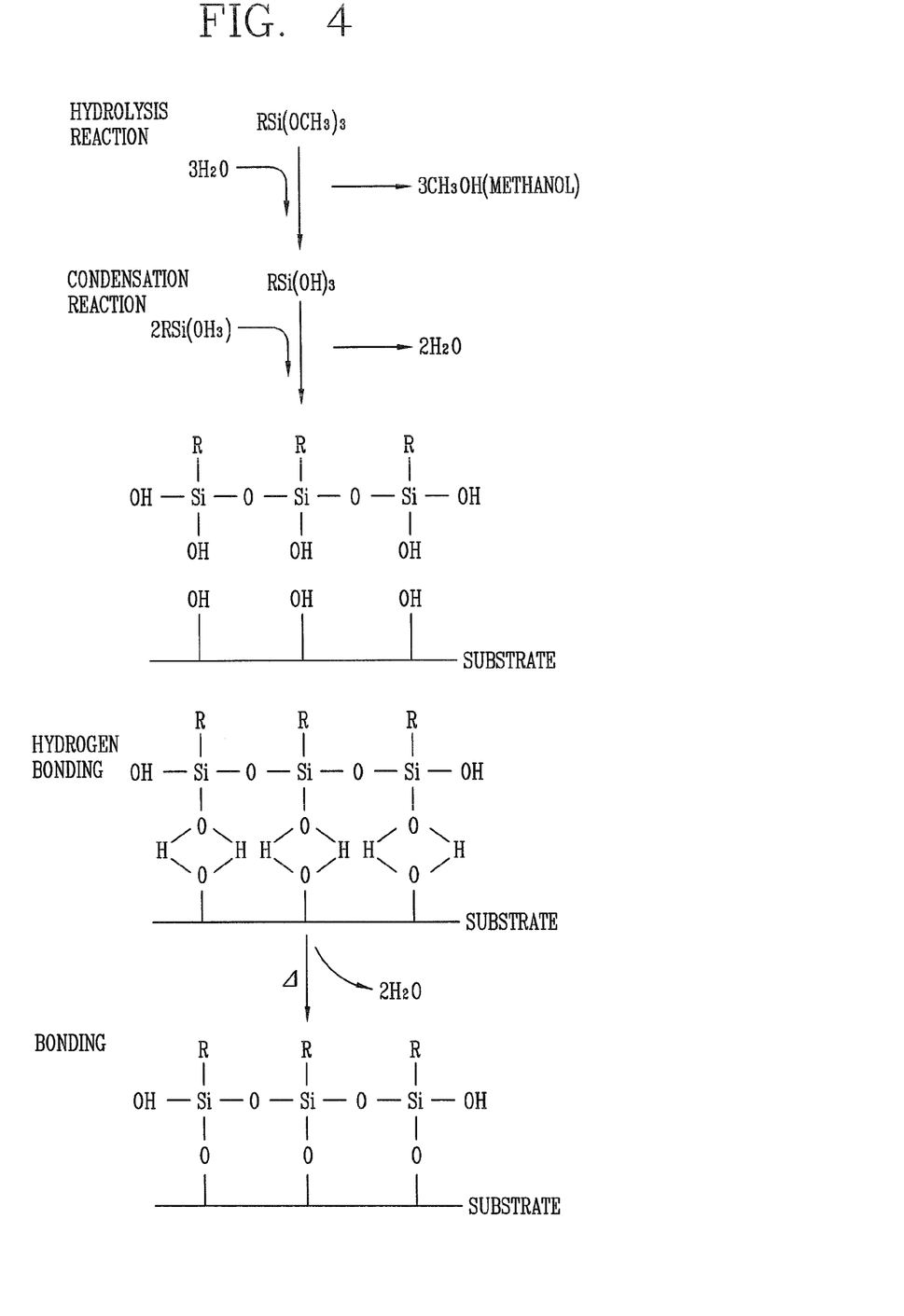
FIG. 4 is a view showing a reaction of a resist ink responsive to a silane coupling agent in accordance with the present invention.

Referring to FIG. 4, if water is applied to a silane coupling agent having one side terminal with an organic functional group R and another side terminal with methoxy group (ethoxy is also possible), the silane coupling agent is hydrolyzed to become $RSi(OH)_3$ and methanol ($3CH_3OH$). The hydrolyzed $RSI(OH)_3$ is subjected to a condensation reaction so that water is given off, resulting in coupling between oxygen molecule and Si molecules (Si—O—Si). Here, the OH-group is coupled to the Si molecules and the OH-group is then subjected to a hydrogen bonding to OH-group of a substrate.

Referring back to FIG. 3C, the resist ink patterns 138 transcribed onto the etching target layer 160a are baked at a temperature of about 150° C. for about 3 minutes. The baking process heats up the hydrogen-bonded molecules, so that water is given off from the hydrogen-bonded molecules. Accordingly, Si is coupled to O of the substrate or metal layer, and accordingly the organic functional group R is coupled to the substrate or metal layer. In other words, the silane coupling agent allows the organic functional group to be coupled by the silane crosslink (Si—O—Si) and also to be firmly coupled to the surface of the substrate or metal layer.

As mentioned above, the present invention forms the crosslink in the resist ink by adding the coupling agent to the resist ink. The detailed components of the resist ink will be described hereinafter.

The resist ink according to the present invention is composed by mixing in a solvent a base polymer such as resin, a tackifier for improving a printing property of the resist ink, an additive such as surfactant or dye, a coupling agent such as silane coupling agent and the like.

Here, the solvent may be one of an alcohol solvent having a low boiling point of less than 80° C., such as ethanol or methanol, or an alkyl solvent, a phenyl solvent, an unsaturated solvent, an amine sensitive solvent or the like.

Here, the alcohol solvent, the alkyl solvent, the phenyl solvent, the unsaturated solvent, the amine sensitive solvent or the like may be used as a carrier solvent of the resist ink, and ethoxypropanol may be used as a printing solvent of the resist ink.

Thus, two types of solvents, namely, the carrier solvent and the printing solvent are used as a solvent in the following aspects. As shown in FIGS. 3B and 3C, after the resist ink 133' is partially transcribed from the roll 131 to the cliché 130, the remnant resist ink patterns 133a are transcribed onto the etching target layer 160a of the substrate 150. Hence, for each transcription of the resist ink 133 onto the cliché 130 and onto the etching target layer 160a, appropriate solvents should be selected for a smooth transcription. The present invention uses a solvent prepared by mixing ethanol or methanol as a solvent having a low boiling point and ethoxypropanol as a solvent having a high boiling point in the ratio of approximately 9:1, allowing the resist ink 133 to be smoothly transcribed onto the cliché 130 and onto the etching target layer 160a.

The present invention may produce the resist ink by mixing 70% by weight of the solvent in which the carrier solvent and the printing solvent are mixed in the ratio of 9:1, 10-15% by weight of base polymer such as resin, 10-15% by weight of tackifier, 3% or less by weight of additive and 1-10% by weight of silane coupling agent.

Here, the carrier solvent may be one selected from alcohol such as ethanol or methanol, a silane solvent, a phenyl solvent, an unsaturated solvent and an amine sensitive solvent.

Also, the silane coupling agent may be one selected for use from methacryloxy propyltrimethoxy silane, γ-mercaptopropyltriethoxy silane, N-(2-aminoethyl)-3-aminopropyltrimethoxy silane, N-[2(vinylbenzylamino)-ethyl]-3-aminopropyltrimethoxy silane, 3-methacryloxy propyltrimethoxy silane and 3-glycidoxy propyltrimethoxy silane.

Especially, methacryloxy propyltrimethoxy silane or N-(2-aminoethyl)-3-aminopropyltrimethoxy silane may be used upon using the ethanol solvent for the resist ink, and γ-mercapto-propyltriethoxy silane may be used upon using the methanol solvent for the resist ink. Also, N-(2-aminoethyl)-3-aminopropyltrimethoxy silane may be used upon using a thermosetting solvent for the resist ink.

In addition, N-(2-aminoethyl)-3-aminopropyltrimethoxy silane may be used upon using the alkyl solvent as the thermoplastic solvent, and N-[2(vinylbenzylamino)-ethyl]-3-aminopropyltrimethoxy silane may be used upon using the phenyl solvent. 3-methacryloxy propyltrimethoxy silane may be used upon using the unsaturated solvent, and 3-glycidoxy propyltrimethoxy silane may be used upon using the amine sensitive solvent.

Thus, the present invention adds a coupling agent such as the silane coupling agent so as to crosslink the resist ink, thereby enhancing the coupling between the resist ink and the etching target layer, which results in preventing a defect occurrence, due to a liquation of non-crosslinked components of the resist ink upon wet etching, and achieving a strong acid-resistance.

The thusly fabricated resist patterns according to the present invention may not be limitedly applied only to the printing method shown in FIGS. 3A to 3E.

For instance, another method may also be applicable, in which under a state where a transcription roll having grooves each filled with a resist ink is prepared and the transcription roll comes in contact with a printing roll, the transcription roll and the printing roll are rotated (rolled) so as to transcribe the resist ink onto the printing roll, and then the printing roll is rotated in a contact state with an etching target layer on a substrate to re-transcribe the resist ink onto the etching target layer, thereby forming resister patterns.

Another method may alternatively be applicable, in which after a cliché having grooves is prepared and a resist ink is filled in each groove, a roll is rotated in a contact state with the cliché so as to transcribe the resist ink filled in each groove onto the surface of the roll and then the roll is rotated in a contact state with a surface of a substrate to re-transcribe the resist ink transcribed on the surface of the roll onto a surface of an etching target layer, thereby forming resist patterns.

Consequently, the resist ink fabricated according to the present invention may not be limited to a specific method but applicable to any fabrication method as long as it can form color filters by transcribing the resist ink by use of a roll or a cliché.

Hereinafter, description will be given of a method for fabricating a liquid crystal display (LCD) device by employing the above resist ink and printing method.

FIGS. 5A to 5H are views showing a method for fabricating an LCD device in accordance with the present invention.

Figure 5A:
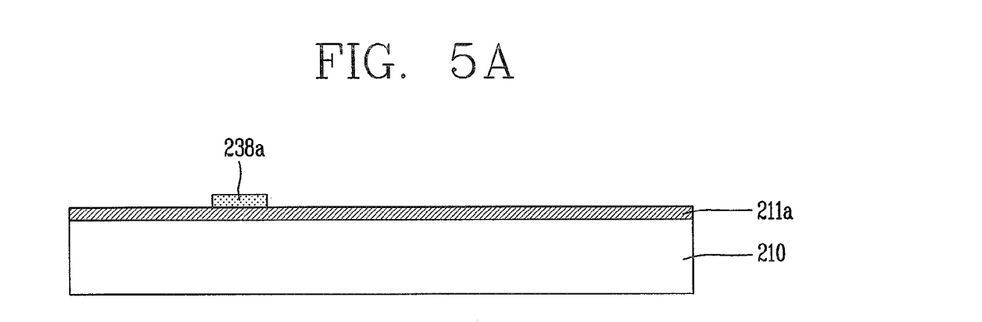
FIGS. 5A to 5H are views showing a method for forming an LCD device in accordance with the present invention.

First, referring to FIG. 5A, a first metal layer 211a as a single layer or a dual layer, formed of Al, Mo, Cr, Cu, Al alloy, Mo alloy, Cr alloy and Cu alloy, is formed, by sputtering, on a first substrate 210 made of a transparent material like glass.

A resist ink is prepared by mixing a solvent composed of ethanol or methanol and ethoxypropanol, a base polymer such as resin, a tackifier, an additive and a silane coupling agent, so as to be coated on the roll 131 as shown in FIGS. 3A and 3B. The coated resist ink is partially removed by a cliché, thereby forming a resist pattern. Afterwards, the roll 131 is rotated in a contact state with the first metal layer 211a so that the resist pattern is transcribed onto the first metal layer 211a, thereby forming a first resist pattern 238a on the first metal layer 211a.

Figure 5B:
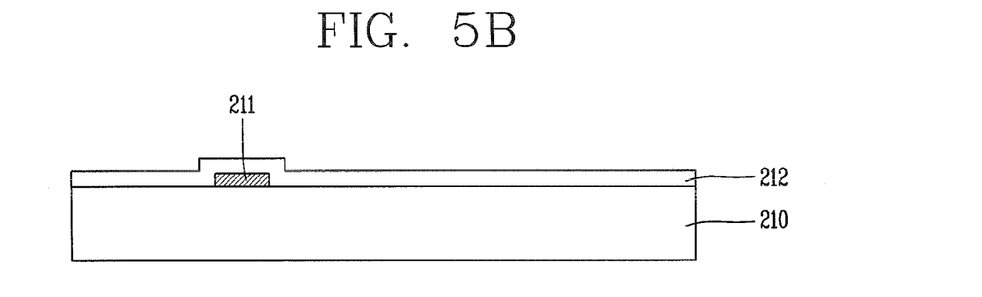

Referring to FIG. 5B, an etching solution is applied in a state of partially blocking the first metal layer 211a by use of the first resist pattern 238a to etch the first metal layer 211a, thereby forming a gate electrode 211 on the substrate 210. Chemical vapor deposition (CVD) is then followed to form a gate insulating layer 212 made of an inorganic material, such as $SiO_2$ or $SiN_2$.

Figure 5C:
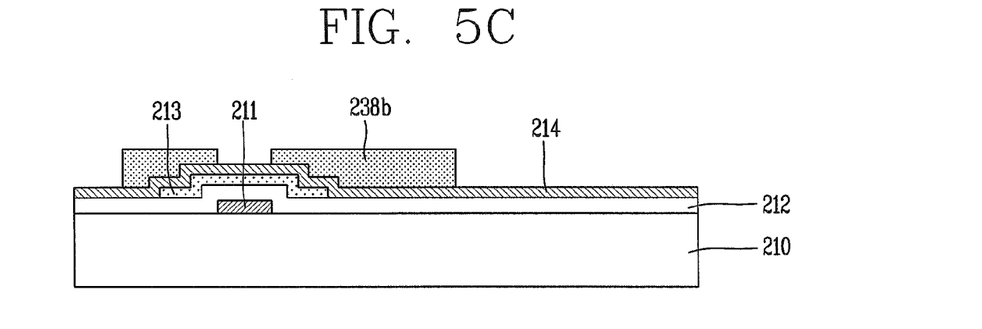

Afterwards, as shown in FIG. 5C, the first substrate 210 having the gate electrode 211 formed thereon is entirely deposited with an amorphous silicon or the like by the plasma enhanced chemical vapor deposition (PECVD), which is followed by etching, thereby forming a semiconductor layer 213. A second metal layer 214 as a single layer or a dual layer, formed of Al, Mo, Cr, Cu, Al alloy, Mo alloy, Cr alloy and Cu alloy, is formed on the entire first substrate 210, on which the semiconductor layer 213 is formed. The resist ink, fabricated in accordance with the present invention by the printing method shown in FIGS. 3A to 3C, is transcribed on the second metal layer 214, to thereby form second resist patterns 238b on the second metal layer 214.

Here, although not shown, the semiconductor layer 213 may also be etched by use of the resist ink according to the present invention. That is, after forming a resist pattern on a semiconductor layer by the printing method shown in FIGS. 3A to 3C, the semiconductor layer is etched by use of an etching gas, to thereby form the semiconductor layer 213.

Figure 5D:
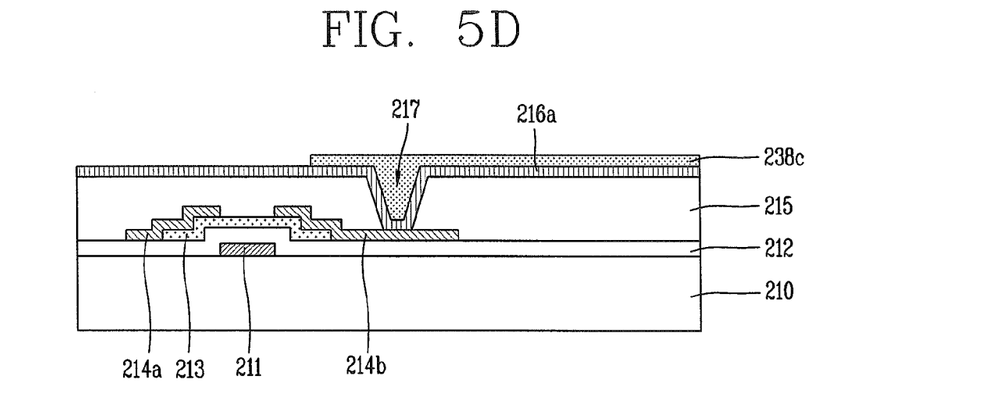

Referring to FIG. 5D, the second metal layer 214 is then etched with an etching solution by use of the second resist patterns 238b, to form a source electrode 214a and a drain electrode 214b on the semiconductor layer 214. Afterwards, a passivation layer 215 defined as an inorganic insulating layer or organic insulating layer is formed all over the first substrate 210. The passivation layer 215 is then etched to form a contact hole 217 so that the drain electrode 214b is exposed. A transparent conductive material such as indium tin oxide (ITO) or indium zinc oxide (IZO) is stacked on the passivation layer 215 and the contact hole 217 by sputtering, thereby forming a third metal layer 216a. Here, although not shown, the contact hole 217 may also be formed by use of the resist ink according to the present invention. That is, after forming a resist pattern on the passivation layer 215 by employing the printing method shown in FIGS. 3A to 3C, the passivation layer 215 is etched with an etching gas, so as to form the contact hole 217.

Then, the resist ink fabricated according to the present invention is transcribed on the third metal layer 216a by employing the printing method shown in FIGS. 3A to 3C, thereby forming a third resist pattern 238c on the third metal layer 216a.

Figure 5E:
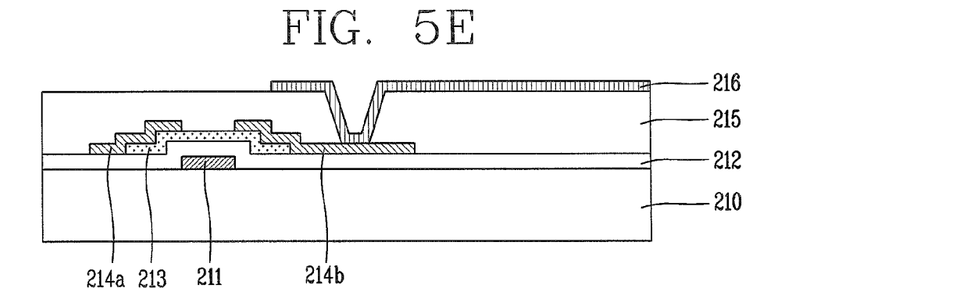

Referring to FIG. 5E, the third metal layer 216a is etched with an etching solution by use of the third resist pattern 238c, so as to form a pixel electrode 216, electrically connected to the drain electrode 214b, on the passivation layer 215.

Figure 5F:
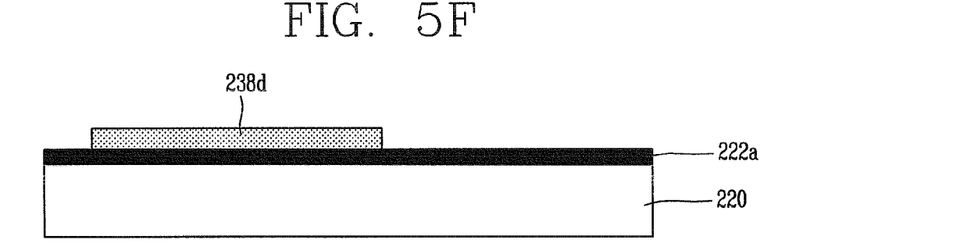

Referring to FIG. 5F, on a second substrate 220 made of a transparent material like glass is formed an opaque fourth metal layer 222a defined as a single layer of Cr or a dual layer of Cr/CrO2 by the sputtering. The resist ink fabricated according to the present invention is then transcribed on the fourth metal layer 222a by employing the printing method, thereby forming a fourth resist pattern 238d on the fourth metal layer 222.

Figure 5G:
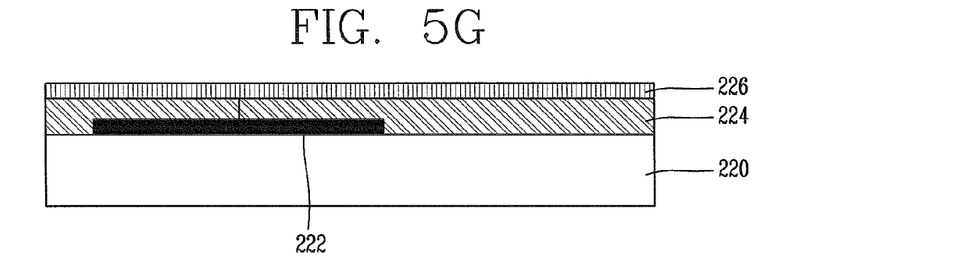

Referring to FIG. 5G, the fourth metal layer 222a is etched by use of the fourth resist pattern 238d, to form a black matrix 222. Although not shown, the black matrix 222 may usually be formed on an image non-display portion, such as a portion on which a thin film transistor is formed or a portion on which various electrodes are formed. Afterwards, a color filter layer 224 is formed on the second substrate 220, and a common electrode 226 formed of ITO or IZO is formed on the color filter layer 224.

Figure 5H:
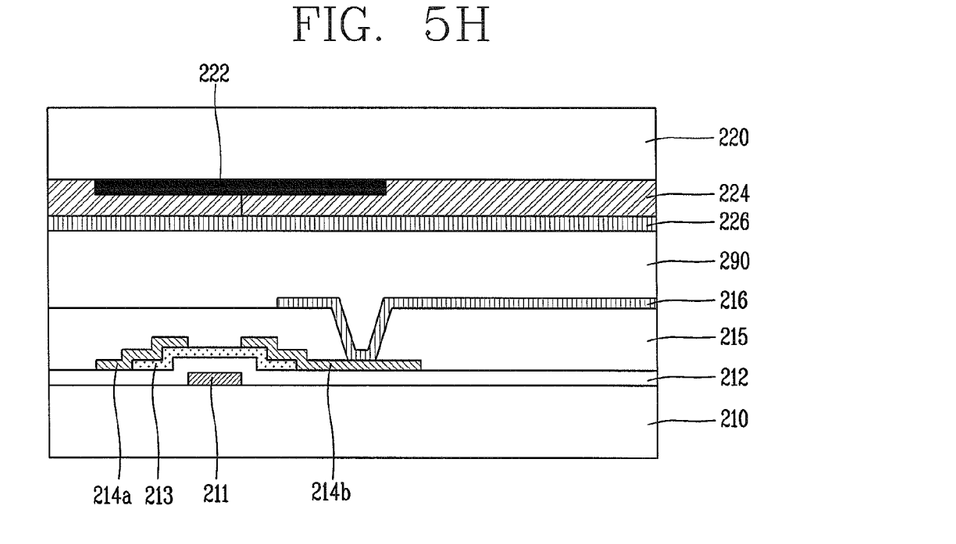

Afterwards, as shown in FIG. 5H, after attaching the first substrate 210 and the second substrate 220, a liquid crystal layer 290 is formed between the first and second substrates 210 and 220, thereby fabricating an LCD device. Typically, the liquid crystal layer 290 is formed by injecting liquid crystal between the first and second substrates 210 and 220 after attaching the two substrates 210 and 220. Alternatively, a liquid crystal layer may be formed in a manner that liquid crystal may be dispensed on the first substrate 210 having a thin film transistor or the second substrate 220 having the color filter layer 224 and a pressure is applied to both the first and second substrates 210 and 220 so that the dispensed liquid crystal can be uniformly distributed all over the substrates 210 and 220.

As described above, the present invention fabricates a new resist ink and uses the same to etch metallic layers such as various electrodes or black matrix of an LCD device; however, the present invention may not be limitedly applied to fabricate the LCD devices. For instance, the resist ink according to the present invention may be useable for etching metal layers of a semiconductor or the like.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A resist ink comprising:
   70% or less by weight of solvent;
   10-15% by weight of base polymer;
   10-15% by weight of tacktifier;
   3% or less by weight of additive; and
   1-10% by weight of coupling agent,
   wherein the solvent includes a carrier solvent and a printing solvent mixed in the ratio of 9:1.

2. The resist ink of claim 1, wherein
   the printing solvent has a boiling point higher than that of the carrier solvent.

3. The resist ink of claim 1, wherein the carrier solvent comprises ethanol or methanol, and the printing solvent comprises ethoxypropanol.

4. The resist ink of claim 1, wherein the additive comprises surfactant and dye.

5. The resist ink of claim 1, wherein the coupling agent has a boiling point equal to or higher than 200° C.

6. The resist ink of claim 1, wherein the coupling agent is one selected from a group consisting of a metal coupling agent and phosphate coupling agent, the metal coupling agent including titanate, organic chrome complex and aluminate.

7. The resist ink of claim 1, wherein the solvent is ethanol, and the coupling agent is methacryloxy propyltrimethoxy silane or N-(2-aminoethyl)-3-aminopropyltrimethoxy silane.

8. The resist ink of claim 1, wherein the solvent is methanol and the coupling agent is γ-mercapto-propyltriethoxy silane.

9. The resist ink of claim 1, wherein the solvent is thermosetting, and the coupling agent is N-(2-aminoethyl)-3-aminopropyltrimethoxy silane.

10. The resist ink of claim 1, wherein the solvent is an alkyl solvent and the coupling agent is N-(2-aminoethyl)-3-aminopropyltrimethoxy silane.

11. The resist ink of claim 1, wherein the solvent is a phenyl solvent and the coupling agent is N-[2(vinylbenzylamino)-ethyl]-3-aminopropyltrimethoxy silane.

12. The resist ink of claim 1, wherein the solvent is an unsaturated solvent and the coupling agent is 3-methacryloxy propyltrimethoxy silane.

13. The resist ink of claim 1, wherein the solvent is an amine sensitive solvent and the coupling agent is 3-glycidoxy propyltrimethoxy silane.

* * * * *